US008334796B2

(12) United States Patent
Wani et al.

(10) Patent No.: US 8,334,796 B2
(45) Date of Patent: Dec. 18, 2012

(54) HARDWARE EFFICIENT ON-CHIP DIGITAL TEMPERATURE COEFFICIENT VOLTAGE GENERATOR AND METHOD

(75) Inventors: Barkat A. Wani, San Jose, CA (US); Raul-Adrian Cernea, Santa Clara, CA (US)

(73) Assignee: SanDisk Technologies Inc., Plano, TX (US)

(*) Notice: Subject to any disclaimer, the term of this patent is extended or adjusted under 35 U.S.C. 154(b) by 0 days.

(21) Appl. No.: 13/083,515

(22) Filed: Apr. 8, 2011

(65) Prior Publication Data
US 2012/0256772 A1 Oct. 11, 2012

(51) Int. Cl.
*H03M 1/00* (2006.01)
(52) U.S. Cl. ............... 341/110; 365/189.3
(58) Field of Classification Search .......... 341/110; 365/193, 189.3, 200, 212, 63, 185.21, 185.03, 365/185.02, 210.11; 702/130; 716/100
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,643,889 B2 * | 1/2010 | Jeong et al. ............. 374/170 | |
| 2004/0062085 A1 | 4/2004 | Wang et al. | |
| 2006/0222188 A1 | 10/2006 | Asakawa | |
| 2008/0031066 A1 | 2/2008 | Nandi | |
| 2008/0159000 A1 | 7/2008 | Li et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
"A 3bit/Cell 32Gb NAND Flash Memory at 34nm with 6MB/s Program Throughput and with Dynamic 2b/Cell Blocks Configuration Mode for a Program Throughput increase up to 13MB/s", ISSCC 2010 Conference, Session 24, DRAM and Flash Memories, 24.7, Digest of Technical Papers, pp. 444-445.
Notification of Transmittal of the International Search Report and The Written Opinion of the International Searching Authority, or the Declaration for Int'l Application No. PCT/US2012/030455, mailed Jun. 19, 2012, 9 pages.

* cited by examiner

*Primary Examiner* — Joseph Lauture
(74) *Attorney, Agent, or Firm* — Davis Wright Tremaine LLP

(57) ABSTRACT

An on-chip DC voltage generator and hardware efficient method provide for generating linear DC voltages with a programmable negative temperature coefficient. A temperature-dependent DC voltage is digitally derived from an on-chip temperature readout, a programmable digital word to control the temperature coefficient and a programmable digital word to adjust the digital level. The digital result is applied to a resistor string digital to analog converter (DAC) to generate an analog DC voltage with a negative temperature slope. Additionally, another programmable digital word for trimming allows convergence at a given temperature of voltages having a common level but different temperature coefficients. These voltages can be applied to the word line in the flash memory and track the threshold voltage of the memory cell, which has a negative temperature coefficient, such that the difference between the gate voltage and the threshold voltage is constant over temperature.

24 Claims, 9 Drawing Sheets

Conventional Programming with alternating Progam/Verify sequence for a 4-state memory

HARDWARE EFFICIENT ON-CHIP DIGITAL TEMPERATURE COEFFICIENT VOLTAGE GENERATOR AND METHOD

FIELD OF THE INVENTION

This invention relates generally to voltage generators and methods in semiconductor devices such as non-volatile semiconductor memory, and more particularly to a dc voltage generator with digitally adjustable parameters including negative temperature coefficient, dc level and convergence point.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

In order to provide the voltages for memory operations such as the programming and verify operations, as well as any read operations, a voltage generator capable of generating the various DC voltage levels on demand is required. Furthermore, the operations mostly depend on the thresholds of the FET and EEPROM devices making up the circuits and the memory cells. The thresholds of these FET and EEPROM devices changes with temperature. In order to maintain regularity in operation, a common type of these devices need to be supplied with an operating voltage that has a negative temperature coefficient.

United States Patent Publication No. 2004/0062085 A1 discloses an on-chip voltage generator having such capabilities. The voltage generator is implemented with analog circuitry, which occupies substantial space on the chip.

United States Patent Publication No. 2008/0031066 A1 and United States Patent Publication No. 2008/0159000 A1 both disclose on-chip voltage generators that are also analog.

"A 3 bit/Cell 32 Gb NAND Flash Memory at 34 nm with 6 MB/s Program Throughput and with Dynamic 2b/Cell Blocks Configuration Mode for a Program Throughput increase up to 13 MB/s", ISSCC 2010 Conference, Session 24, DRAM and FLASH MEMORIES, 24.7, Digest of Technical Papers, pp. 444-445, discloses a voltage generator with a digital component where the computation involves looking up values from various stored tables.

Existing voltage generators involve the use of many operational amplifiers, R-2R digital to analog converters and associated circuitry to add and subtract voltages with and without temperature coefficients to generate final voltages with negative temperature coefficients. These implementations tend to be expensive, complex, resource intensive and bulky. Furthermore, they suffer from the drawback that voltages with various negative temperature coefficients but the same DC level would not converge at a trimming temperature. The convergence would be approximate but not exact. Also, there was no way to move the convergence point to compensate for process and other random variations.

Therefore there is a general need for an on-chip, voltage generator which is compact and inexpensive to implement and flexible in terms of programmability and has the facility to move the trimming point in order to achieve an exact convergence at one temperature point in spite of variations due to the type of devices and fabrication processes.

SUMMARY OF INVENTION

According to a general aspect of the invention, an on-chip DC voltage generator and hardware efficient method provide for generating linear DC voltages with a programmable negative temperature coefficient. A temperature-dependent DC voltage is digitally derived from an on-chip temperature readout, a programmable digital word to control the temperature coefficient and a programmable digital word to adjust the digital level. The digital result is applied to a resistor string digital to analog converter (DAC) to generate an analog DC voltage with a negative temperature slope. These voltages can be applied to the word line in the flash memory and track the threshold voltage of the memory cell, which has a negative temperature coefficient, such that the difference between the gate voltage and the threshold voltage is constant over temperature.

In a preferred embodiment the DC voltage generator includes an analog-to-digital converter (ADC) to convert a proportional to absolute temperature (PTAT) voltage to a digital temperature readout; a digital regulator for digitally computing a product of an inverse of the digital temperature readout and a digital word representing a temperature coefficient of the voltage and for adding the product to a code word representing a level of the voltage to obtain a resultant digital word; and a digital-to-analog converter (DAC) for converting the resultant digital word to output an analog voltage.

According to another aspect of the invention, the ADC in the DC voltage generator is a flash ADC having a trimmable resistor in series with a reference resistor string. The value of the trimmable resistor is controlled by a programmable digital word for trimming, which allows the DC generator to output voltages having a common level but different temperature coefficients to converge at a given temperature, such as at a maximum operating temperature of the chip.

The advantage of the present invention is that an on-chip, voltage generator is provided, which has greater linearity, simpler hardware and area efficiency. The linearity is only limited by the resolution of the temperature sensor ADC and the resistor string DAC. In theory, this approach can be extended to any number of bits of resolution. For example, if one has a 15-bit accurate temperature sensor ADC, and the resistor string DAC is also 15-bit accurate, the output voltages can be accurate upto a 15-bit level. The inversion, multiplication and summation do not introduce any errors. The method offers flexibility of programmability and has the facility to move the trimming point in order to achieve an exact convergence at one temperature point in spite of variations due to the type of devices and fabrication processes.

Additional features and advantages of the present invention will be understood from the following description of its preferred embodiments, which description should be taken in conjunction with the accompanying drawings.

DETAILED DESCRIPTION OF THE PREFERRED EMBODIMENTS

Figure 1:
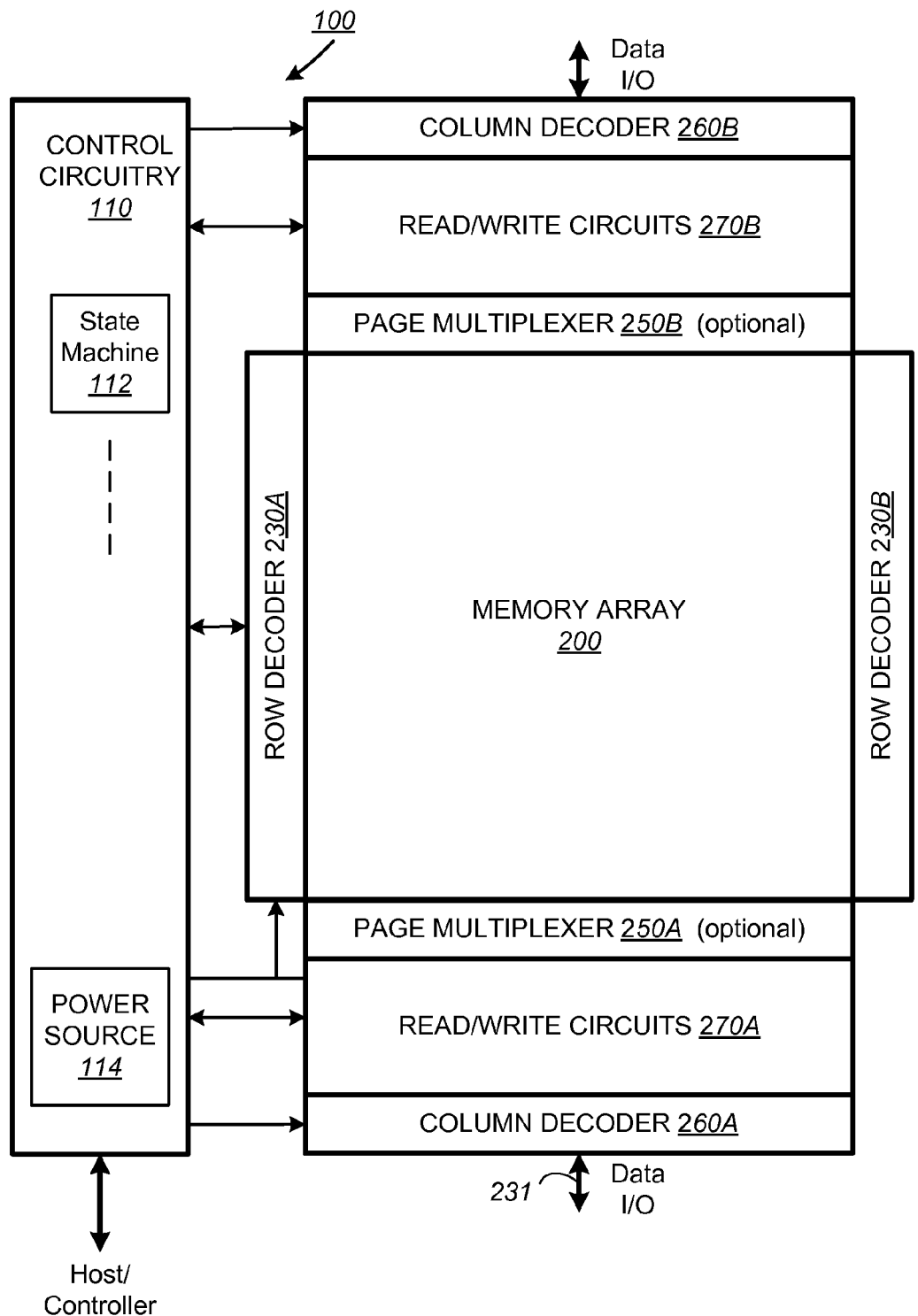
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

The memory array 200 is addressable by word lines via row decoders 230 (split into 230A, 230B) and by bit lines via column decoders 260 (split into 260A, 260B). The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

The control circuitry 110 is an on-chip controller that cooperates with the read/write circuits 270 to perform memory operations on the memory array 200. The control circuitry 110 typically includes a state machine 112 and other circuits such as an on-chip address decoder and a power generator module 114. The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 2:
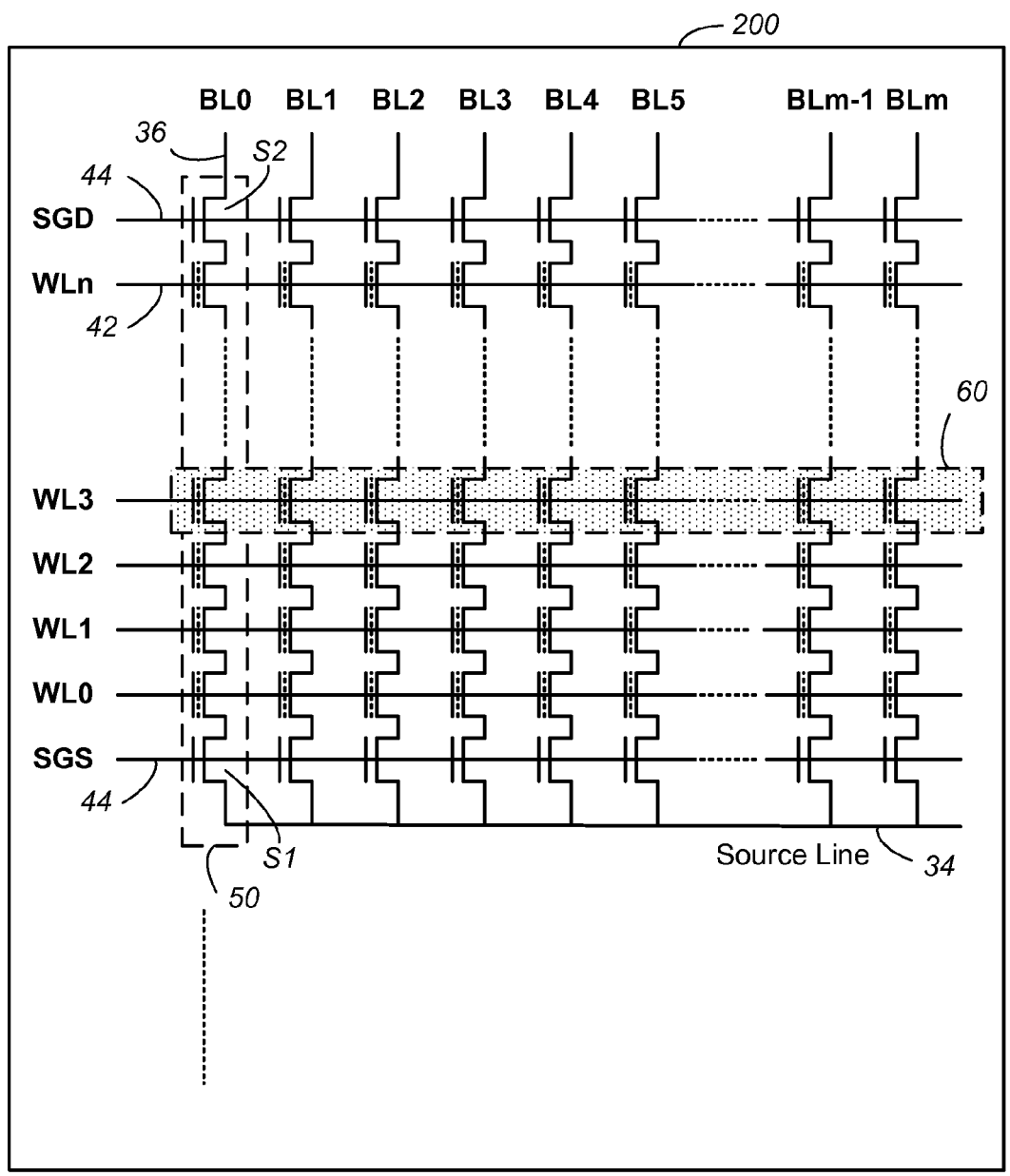
FIG. 2 illustrates a page of memory cells organized, for example in the NAND configuration, being programmed in parallel.

FIG. 2 illustrates a page of memory cells organized, for example in the NAND configuration, being programmed in parallel. FIG. 2 essentially shows a bank of NAND chains 50 from the memory array 200 of FIG. 1. A "page" such as the page 60, is a group of memory cells programmable in parallel, made possible by the control gates of the cells connected in common to a word line 42 and each cell accessible by a sensing circuit module (in the read/write circuits 270A and 270B shown in FIG. 1) accessible via a bit line 36. As an example, when programming the page of cells 60, a programming voltage is applied to the common word line WL3. Prior to programming, those cells that have already been programmed to their target states are programmed inhibited. This is accomplished by effectively reducing the voltage difference between the control gate and the channel region of the cell in order to discourage electrons from tunneling from the source to the floating gate.

Figure 3:
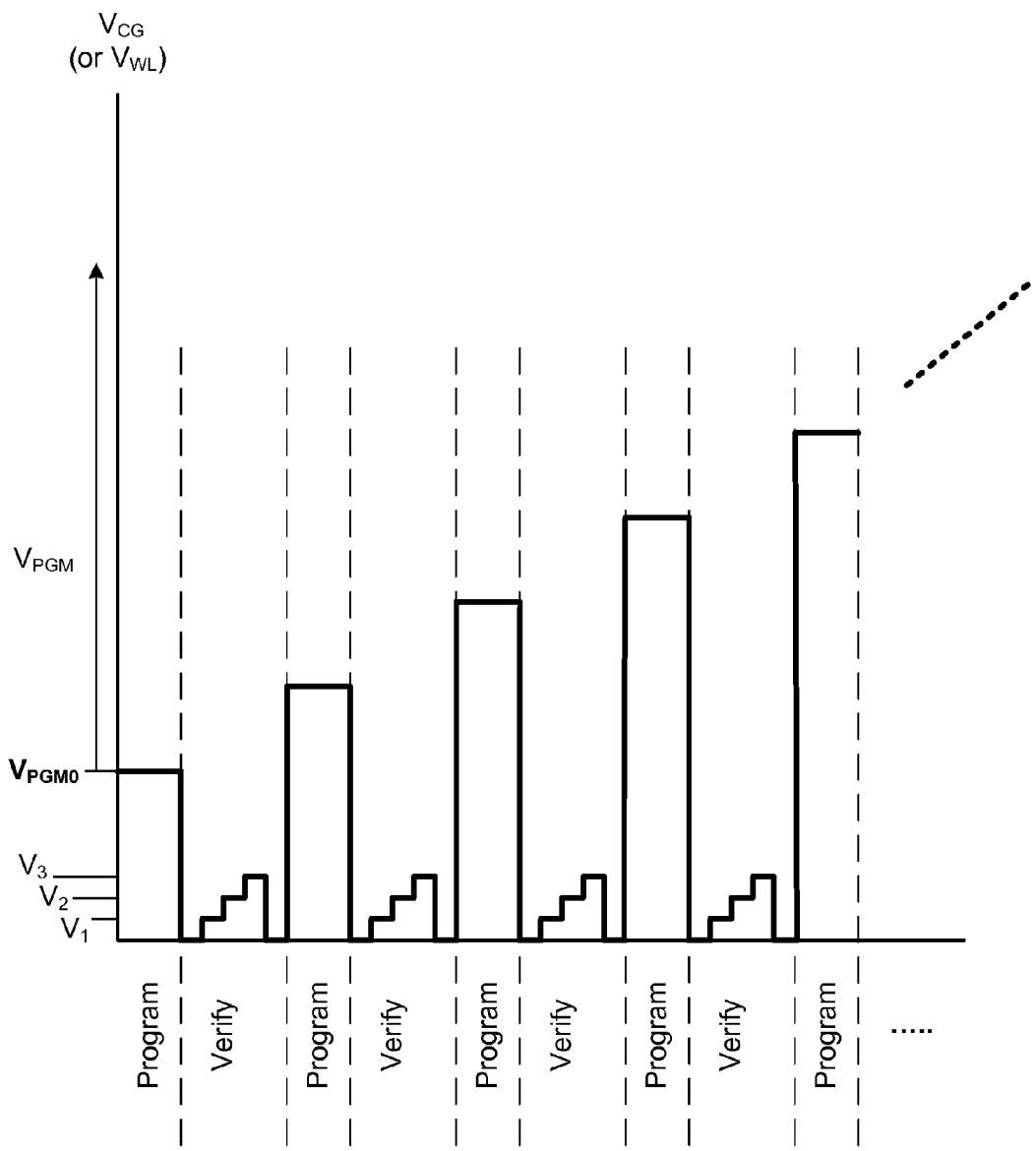
FIG. 3 illustrates a conventional technique for programming a 4-state memory cell to a target memory state.

FIG. 3 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. For a 4-state memory, there will be three verify read points $V_1$, $V_2$ and $V_3$ to distinguish the four possible states. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified. One method of program-inhibiting a memory cell is to raise its bit line voltage from 0V to VCC during programming. In this way, even when the cell's control gate has a programming voltage on it, the effective programming voltage on the floating gate is reduced by VCC, thereby inhibiting further programming of the cell.

In order to provide the voltages for memory operations such as the programming and verify operations shown in FIG. 3, as well as any read operations, a voltage generator capable of generating the various DC voltage levels on demand is required. Furthermore, the operations mostly depend on the thresholds of the FET and EEPROM devices making up the circuits and the memory cells. The thresholds of these FET and EEPROM devices changes with temperature. In order to maintain regularity in operation, a common type of these devices need to be supplied with an operating voltage that has a negative temperature coefficient. A voltage generator capable of programmable DC levels and temperature coefficients, yet compact and versatile, is desirable.

According to a general aspect of the invention, an on-chip DC voltage generator and hardware efficient method provide for generating linear DC voltages with a programmable negative temperature coefficient. A temperature-dependent DC voltage is digitally derived from an on-chip temperature readout, a programmable digital word to control the temperature coefficient and a programmable digital word to adjust the digital level. The digital result is applied to a resistor string digital to analog converter (DAC) to generate an analog DC voltage with a negative temperature slope. These voltages can be applied to the word line in the flash memory and track the threshold voltage of the memory cell, which has a negative temperature coefficient, such that the difference between the gate voltage and the threshold voltage is constant over temperature.

Figure 4:
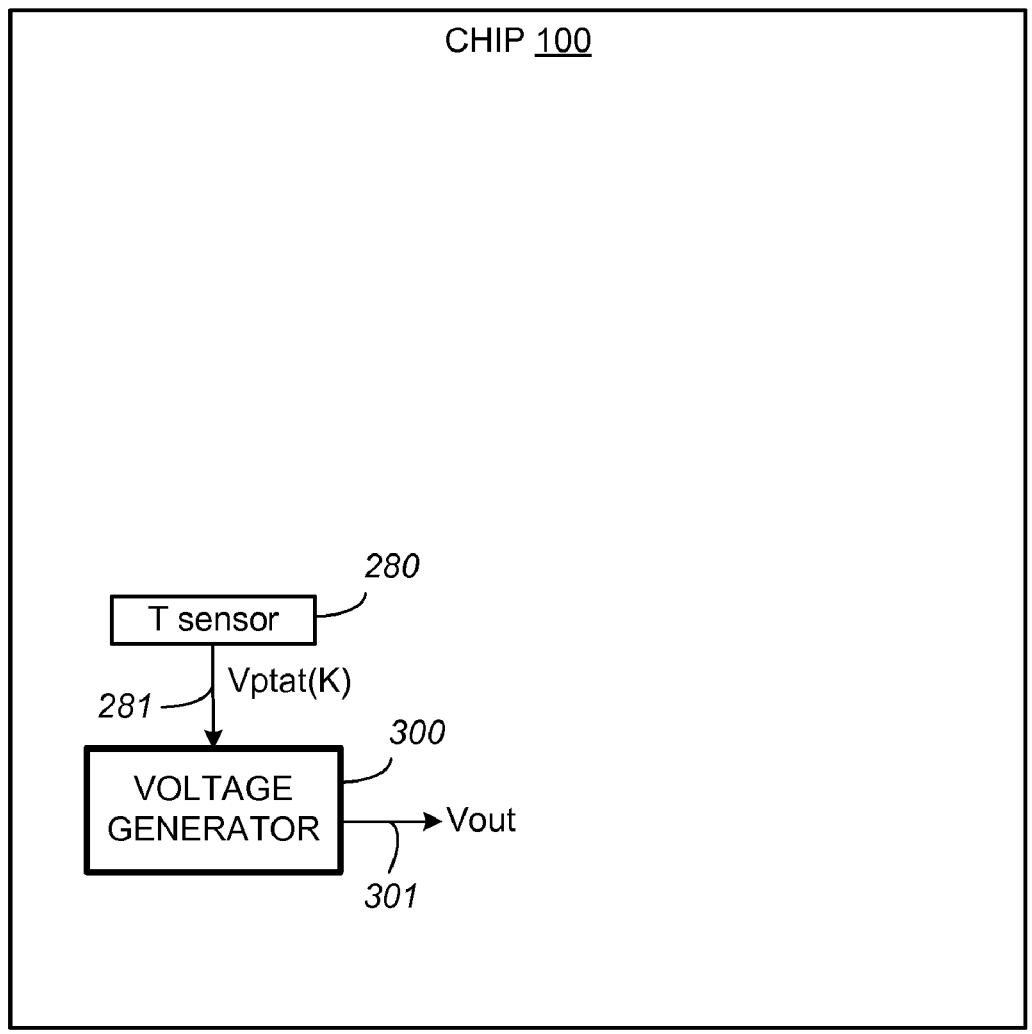
FIG. 4 illustrates an on-chip voltage generator according to a general embodiment of the present invention.

FIG. 4 illustrates an on-chip voltage generator according to a general embodiment of the present invention. The voltage generator 300 is fabricated on an integrated circuit chip 100 such as a nonvolatile memory device to supply DC voltages to operate the device. As will be described later, the voltage generator 300 is implemented by computing the required output voltage function in the digital domain before being converted to an analog output voltage, Vout. The digital manipulation allows the voltage generator to be implemented in a relative simple and compact manner, while being amenable to programmability.

The voltage generator 300 is programmable to supply, via an output 301, a voltage Vout selectable from a range of predefined discrete DC voltage levels. This is accomplished by programming the variable, CGRVdac to a selected value.

The voltage generator 300 is also programmable to supply Vout with a temperature coefficient selectable from a range of predefined discrete temperature coefficients. This is accomplished by programming the variable, TCOdac to a selected value. The voltage generator 300 outputs Vout as a linear function of temperature where the slope or rate of change of the linear function is the temperature coefficient.

An on-chip temperature sensor 280 in the form of a PTAT generator provides a measure of the temperature of the chip and has an output 281 that outputs an analog voltage, Vptat, as a predefined function of the sensed temperature in degree Kelvin (K).

Figure 5:
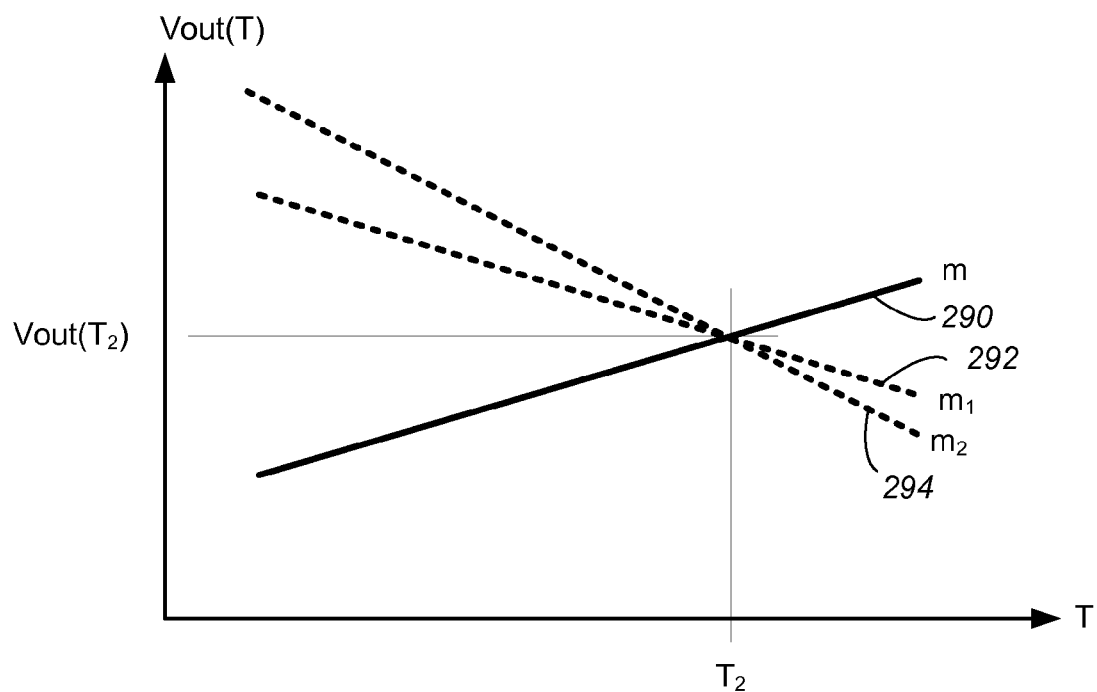
FIG. 5 illustrates the output voltage Vout of the voltage generator shown in FIG. 4.

FIG. 5 illustrates the output voltage Vout of the voltage generator shown in FIG. 4. Generally, Vout is a linear function of temperature. Examples of three curves of Vout are shown, such as a curve 290 with a temperature coefficient of $m_0$, a curve 292 with a temperature coefficient of $m_1$, and a curve 294 with a temperature coefficient of $m_2$. The temperature coefficients $m_1$ and $m_2$ are negative.

The voltage generator 300 puts out Vout over a predefined operating range of temperatures from T1 to T2. In practice, the temperature range is the operating temperature range in which the chip is expected to function. For example, in a preferred embodiment for a memory chip, T1=−40 C and T2=85 C.

The output Vout of the voltage generator may also vary due to process and other variations in its fabrication and implementation. The generator provides a normalization facility so that variations can be normalized by requiring all Vout with different temperature coefficients (m, $m_1$, $m_2$, ...) but same levels to converge at one temperature. In practice it is expedient to have the convergence point at one end of the operating temperature range such as T2 (e.g., 85 degree C.):

$$Vout(m, T_2) = Vout(m_1, T_2) = Vout(m_2, T_2) \qquad \text{Equation (1)}$$

Figure 6:
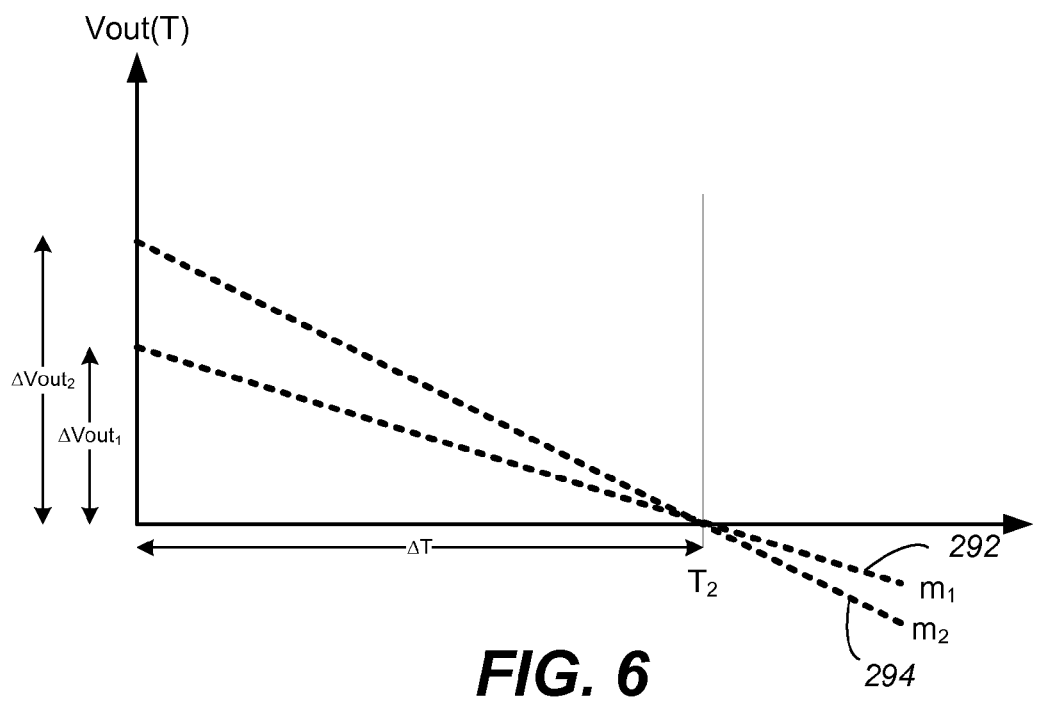
FIG. 6 illustrates examples of the output voltages Vout when they have negative temperature coefficients.

FIG. 6 illustrates examples of the output voltages Vout when they have negative temperature coefficients. For simplicity, only two curves are shown. The curves 292 and 294 respectively have negative temperature coefficients $m_1$ and $m_2$. In general, the slope of each curve is $m_i$ and the intercept of each curve on the Vout-axis is $c_i$, where:

$$m_i = \Delta Vout_i / \Delta T = \Delta Vout_i / T2 = c_i / T2 \qquad \text{Equation (2)}$$

For a linear curve with negative slope:

$$Vout_i = -m_i \cdot T + c_i \qquad \text{Equation (3)}$$

Substituting Equation (2) into Equation (3)

$$\begin{aligned} Vout_i &= -m_i \cdot T + c_i \\ &= -m_i \cdot T + m_i \cdot T2 \\ &= m_i \cdot [T2 - T] \end{aligned} \qquad \text{Equation (4)}$$

Thus, each $Vout_i$ is an output voltage with a corresponding temperature coefficient $m_i$. For example, in one embodiment, the voltage generator can be programmed to output $Vout_i$ with any one of 64 temperature coefficients, then i varies from 0 to 63, and each of the 64 temperature coefficients $m_i$ can be represented by a 6-bit, <5:0> code word, TCOdac.

The temperature domain is also digitalized. For example, in one embodiment, the operating range between T1 and T2 is quantized into 32 gradations, with each gradation represented by a 5-bit, <4:0> code word, Tcode. For example, in binary code, the temperature range starts from T1 corresponding to Tcode0=(000000), then Tcode2=(000001), Tcode3=(000010), . . . and ends at a maximum temperature TcodeMax=Tcode63=(111111). Thus, in the digital domain:

$$[T2 - T] = [TcodeMax - Tcode] \qquad \text{Equation (5)}$$

It can be seen that if Tcode represent an intermediate temperature between Tcode0 and TcodeMax, then [TcodeMax−Tcode]=Tcode* (where Tcode* is the inversion of Tcode.)

Thus, in the digital domain, Equation (4) becomes $$Vout_i = TCOdac_i \cdot Tcode^* \qquad \text{Equation (6)}$$

In order to obtain $Vout_i$ of different DC values, i.e., a shift upwards on the Vout-axis, a digital value, CGRVdac, can simply be added to the right side of Equation (6). For example, in one embodiment, a 9-bit (<8:0>) CGRVdac will provide 512 different DC levels. Thus Equation (6) becomes:

$$Vout_{i,n} = TCOdac_i \cdot Tcode^* + CGRVdac_n \qquad \text{Equation (7)}$$

In this way, for each output voltage curve, $Vout_{i,n}$, it has an nth DC level and an ith value of temperature coefficient. For example, with a $CGRVdac_n$ where n ranges from 0 to 511, and a $TCOdac_i$ where I ranges from 0 to 63, there will be a total of 32768 curves for $Vout_{i,n}$.

Figure 7:
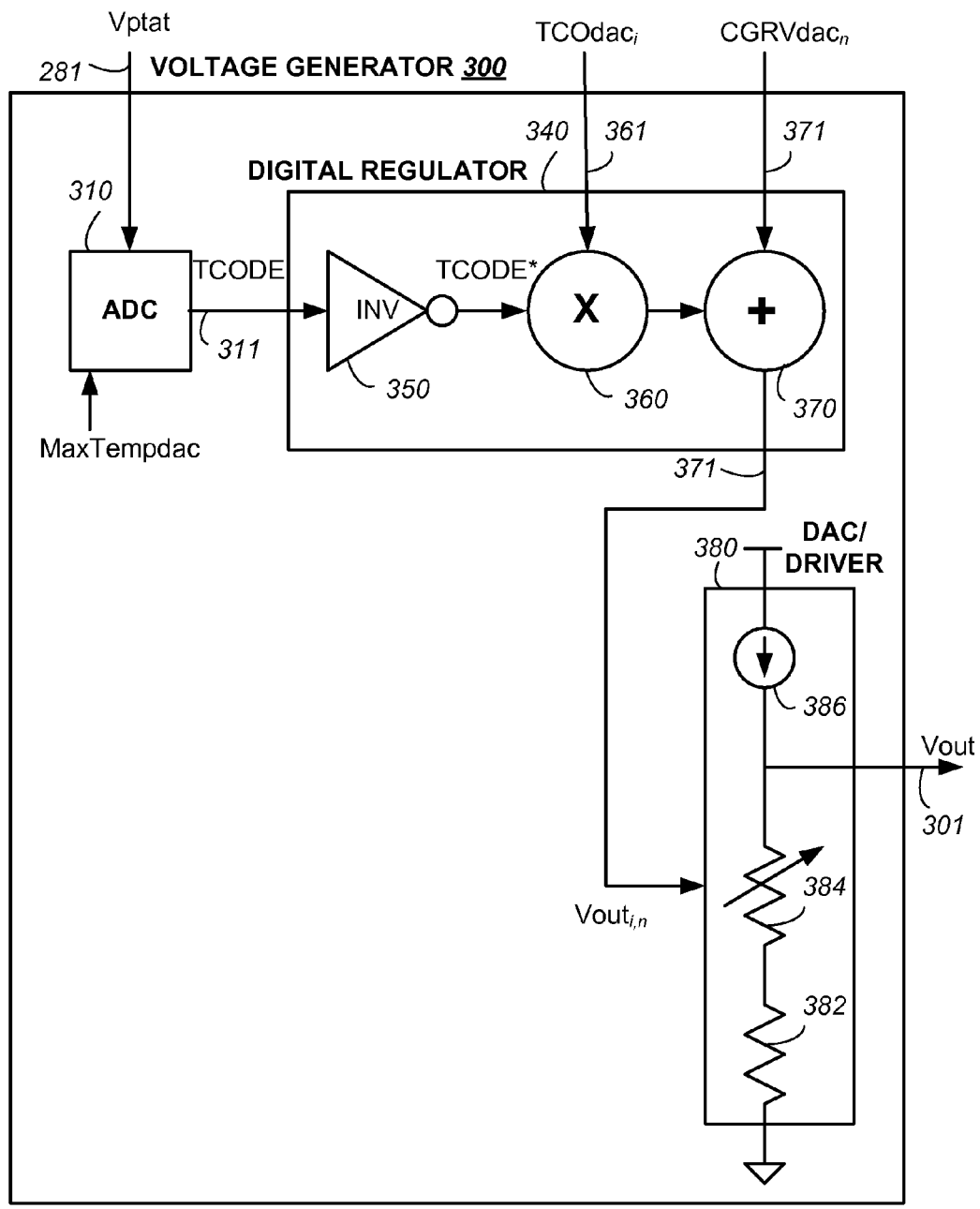
FIG. 7 illustrates schematically a preferred embodiment of the voltage generator shown in FIG. 4.

FIG. 7 illustrates schematically a preferred embodiment of the voltage generator shown in FIG. 4. The voltage generator 300 includes an analog-to-digital converter (ADC) 310, a digital regulator 340 and a digital-to-analog converter (DAC)/driver 380. It can be seen the voltage generator 300 is compact and easy to execute with most of the complexity handled simply in the digital domain. Essentially, the analog temperatures sensed by the sensor 280 shown in FIG. 4 is digitized by the ADC 310 into quanta of temperature steps and each quantum or step is coded with a binary code, Tcode. The digital regulator 340 computes the desired voltage function in the digital domain. Finally, the computed result is converted back to an analog Vout by the DAC/driver 380.

The ADC 310 has an input 281 for receiving Vptat, which is an analog voltage proportional to absolute temperature output by the PTAT generator temperature sensor 280 shown in FIG. 4. The ADC in this design is a standard flash ADC comprised of a bank of comparators that compare equally spaced reference voltages tapped from a reference resistor string, with a voltage that is proportional to absolute temperature (PTAT).

The PTAT voltage is derived from a bandgap reference generation circuit. The bandgap reference circuit generates a PTAT current. When the PTAT current is passed through a resistor, it generates the PTAT voltage. To an approximately first order, the PTAT voltage is linear with temperature. As temperature goes higher, so does the PTAT voltage.

The flash ADC compares this PTAT voltage to the various tap points on the reference resistor string and outputs a thermometer style digital code which in turn is converted into a binary code using a thermometer to binary encoder. The binary output is a digital representation of the temperature. The range of temperatures in which the ADC works is the input range of the ADC and is determined by the difference between the lowest tap and the highest tap in the reference resistor string.

As described earlier, the operating range of temperature between T1 and T2 is quantized and each quantum is represented by a Tcode. The digitalized sensed temperature value will be represented by a Tcode word output at an output 311. The ADC 310 will be described in more details in a later section, particularly with regard to a facility for normalization using a programmable variable, MaxTempdac.

The digital regulator 340 essentially computes the output voltage of the voltage generator in the digital domain. As is clear from Equation (7):

$$Vout_{i,n} = TCOdac_i \cdot Tcode^* + CGRVdac_n$$

$Vout_{i,n}$ is a function of the temperature represented by Tcode*, the temperature coefficient $TCOdac_i$ and also the DC level $CGRVdac_n$. The digital regulator 340 has an input 311 for receiving Tcode, an input 361 for receiving $TCOdac_i$, and an input 371 for receiving $CGRVdac_n$. In order to compute Equation (7), the digital regulator includes an inverter 350, a digital multiplier 360 and a digital adder 370. The inverter 350 inverts Tcode to obtain Tcode*. The digital multiplier 360 computes a product of Tcode* and $TCOdac_i$. The digital adder 370 adds $CGRVdac_n$ to the product to produce $Vout_{i,n}$. In the examples described earlier, an 11-bit product results from the 6-bit TCOdac code word and the 5-bit Tcode code word. Preferably, the product is truncated to 7 bits by dropping 4 LSBs. When the 9-bit CGRVdac code word is added to the product a final computed 9-bit $Vout_{i,n}$ code word is obtained.

The DAC/driver 380 converts the computed code word for $Vout_{i,n}$ to a corresponding analog Vout. In the preferred embodiment, the digital-to-analog driver 380 is implemented by a resistor string DAC (illustrated schematically). In another embodiment, the digital-to-analog driver 380 is implemented by a binary weighted capacitor array.

The DAC/driver 380 includes a resistor string formed by a base resistor 382 and a series of resistors 384 in a DAC configuration (shown schematically). The chain is driven by a temperature independent current source 386 to produce the analog Vout at the output 301 at the top of the string.

Figure 8:
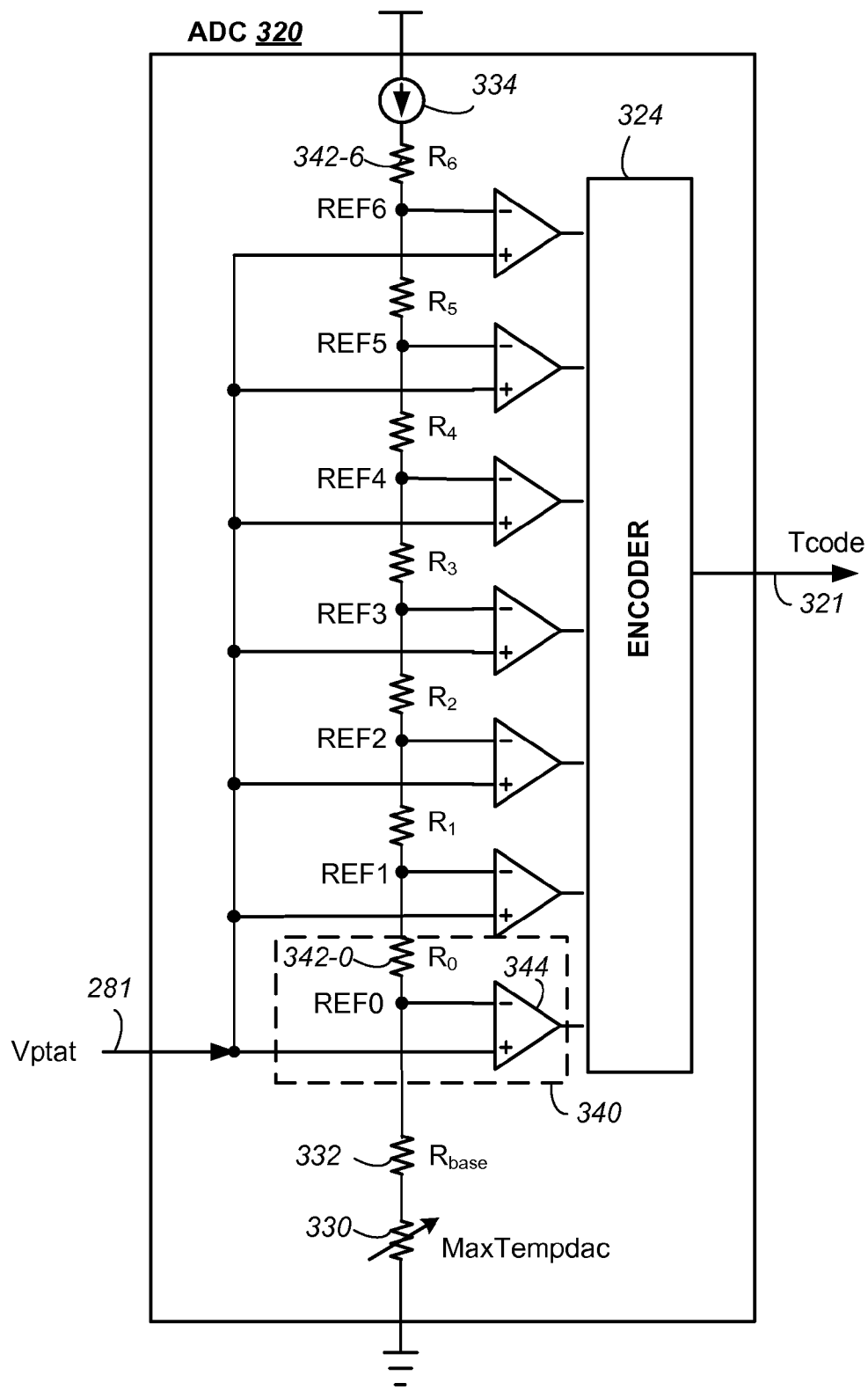
FIG. 8 illustrates in more detail one embodiment of the ADC (analog-to-digital converter) shown in FIG. 7.

FIG. 8 illustrates in more detail one embodiment of the ADC (analog-to-digital converter) shown in FIG. 7. The ADC 310 is used to convert the analog voltage output from the temperature sensor into a digital temperature code word between T1 and T2. In a preferred embodiment, the ADC 310 is implemented by a flash ADC.

A 3-bit example of the ADC 310 is illustrated for simplicity although in a preferred embodiment, the ADC is 5-bit. Generalization to other number of bits is trivial. Basically, between ground and a temperature-independent current source 334 is a reference resistor string formed by Rbase 332, R0, R1, R2, ..., R6, with equally spaced voltage taps, Ref0, Ref1, Ref2, ..., Ref6. Rbase 332 is set so that the voltage at Ref0 is at Vptat(T1) and Ref6 is at Vptat(T2). In this way, the reference resistor string acts as a voltage divider which essentially divide the temperature range T1 to T2 into 7 gradations.

The bank of comparators along with the reference resistor string forms a flash ADC. The analog input Vptat from the temperature sensor is received via line 281 and is compared at each level of the resistor string respectively with the voltages at Ref0 to Ref6. For example, at the lowest level, the flash ADC has a module 340 that includes a comparator 344 to compare Vptat with the voltage at Ref0. As Vptat increases, each of the comparators flips, giving a thermometer code.

Figure 9:
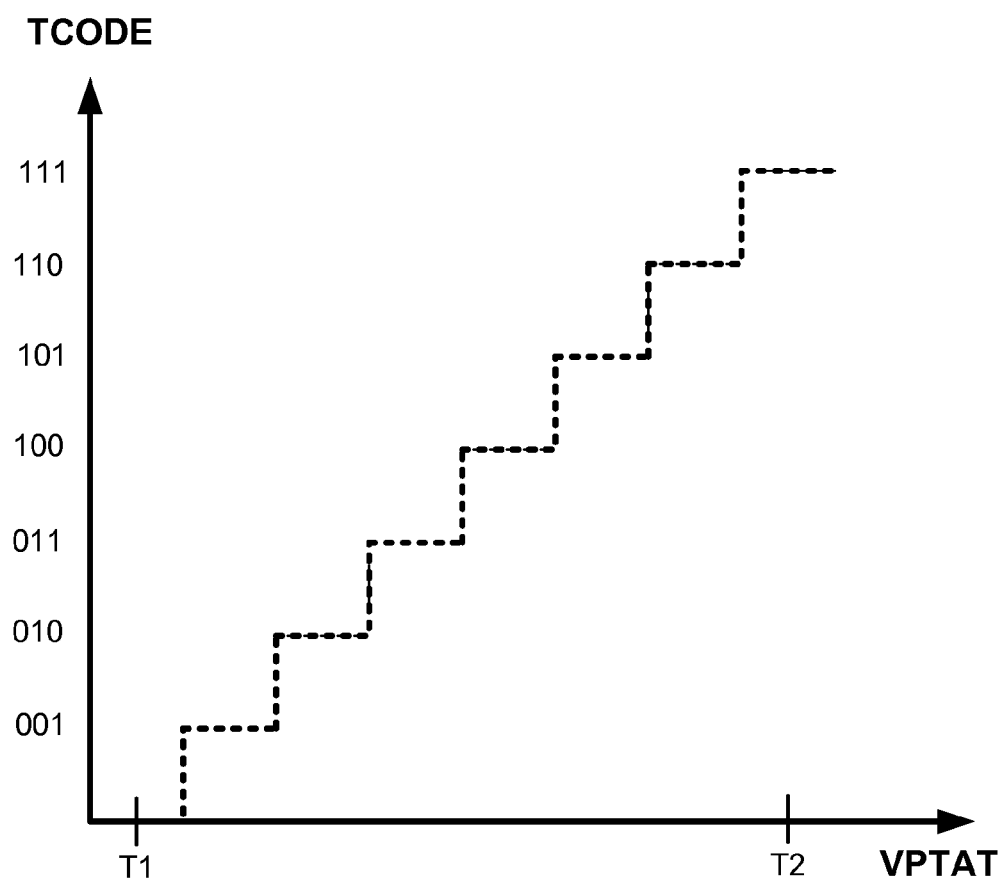
FIG. 9 illustrates the temperature code, Tcode, output from the encoder of the ADC shown in FIG. 8.

FIG. 9 illustrates the temperature code, Tcode, output from the encoder of the ADC shown in FIG. 8. The comparator results from the ADC module 340 of all the levels are input to an encoder 324 which outputs the 3-bit Tcode, which is the digital temperature between T1 and T2 corresponding to the detected Vptat.

The range of the ADC 310 is limited by the lowest and highest reference taps Ref0 and Ref6. Once Vptat goes above Ref6, the highest comparator in the ADC will have flipped and therefore, the output of the ADC saturates as its maximum output code.

In the preferred embodiment, the quantized temperature range extends from T1=−40 degree C. to T2=85 degree C. This range is quantized by a 5-bit flash ADC using 31 comparators.

The point at which the ADC 310 output code saturates should correspond exactly to the maximum temperature T2, which also is the temperature of convergence for all the voltages (see FIG. 5 and FIG. 6 and Equation (1)). However, due to variations in process, the ADC could output the maximum code at either lower than T2 or at a temperature higher than T2.

The change in the maximum Tcode will directly translate to the movement of the output voltage of the generator. As the Tcode saturates at a temperature different from T2, the convergence point of the various Vout will also change to the temperature where the Tcode output saturates.

Programmable Convergence Point

According to another aspect of the invention, the ADC in the DC voltage generator is a flash ADC having a trimmable resistor in series with a reference resitor string. The value of the trimmable resistor is controlled by a programmable digital word for trimming, which allows the DC generator to output voltages having a common level but different temperature coefficients to converge at a given temperature, such as at a maximum operating temperature of the chip.

FIG. 8 illustrates a mechanism provide in the ADC 310 for moving the saturation point of the ADC and therefore the Tcode around T2, such that Equation (1) is satisfied. Essentially, the bottom resistor Rbase 332 in the reference resistor string of the ADC is made trimmable. Equivalently, FIG. 8 illustrates retaining Rbase 332 as a constant portion and a trimmable portion in the trimmable resistor 330. By varying the resistor 330, the entire input range of the ADC is moved either up or down, such that the input range of the ADC stays constant, but the highest and lowest temperature output point of the ADC can be changed to compensate for process variations.

The value of the trimmable resistor 330 is programmable by a multi-bit code word, MaxTempdac. For example, MaxTempdac is a 3-bit code word. The trimmable resistor 330 is implemented as a resistor string, and with appropriate resistor sizes, a temperature range of 30 degree C. over which the maximum TempCode can be moved. Thus from around T2~85 degree C., with MaxTempdac=(000), TempCode (max) can be trimmed down about 70 degree C. With MaxTempdac=(111), TempCode(max) can be trimmed up to about 100 degree C.

In this way, the output Tcode of ADC 310 changes as the MaxTempdac is changed. The saturation point of the ADC moves from around 70 to 100 degree C. Thus the operating temperature range of −40 to 85 degree C., can shift up and down by ±15 degree C.

This trimming translates directly to trimming of the convergence point of the output voltage Vout of the generator 300 shown in FIG. 7. In this way, any voltages programmed with different temperature coefficients but a common DC level can have their convergence point trimmed independently by MaxTempdac so that their voltage levels converge at T2.

Figure 10:
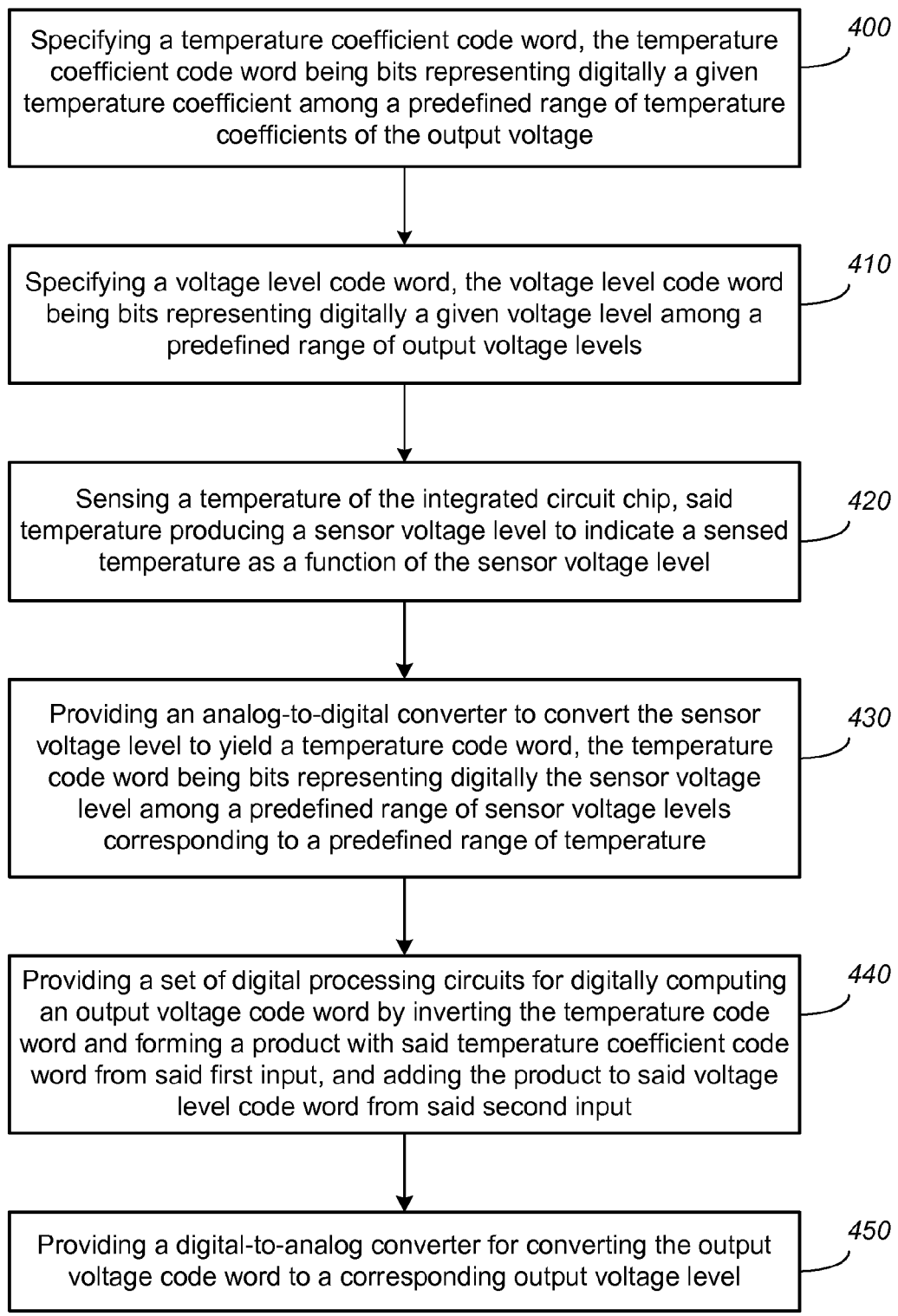
FIG. 10 is a flow diagram illustrating a method of generating a programmable voltage according to the invention.

FIG. 10 is a flow diagram illustrating a method of generating a programmable voltage according to the invention.

STEP 400: Specifying a temperature coefficient code word, the temperature coefficient code word being bits representing digitally a given temperature coefficient among a predefined range of temperature coefficients of the output voltage. Proceed to STEP 410.

STEP 410: Specifying a voltage level code word, the voltage level code word being bits representing digitally a given voltage level among a predefined range of output voltage levels. Proceed to STEP 420.

STEP 420: Sensing a temperature of the integrated circuit chip, said temperature producing a sensor voltage level to indicate a sensed temperature as a function of the sensor voltage level. Proceed to STEP 430.

STEP 430: Providing an analog-to-digital converter to convert the sensor voltage level to yield a temperature code word, the temperature code word being bits representing digitally the sensor voltage level among a predefined range of sensor voltage levels corresponding to a predefined range of temperature. Proceed to STEP 440.

STEP 440: Providing a set of digital processing circuits for digitally computing an output voltage code word by inverting the temperature code word and forming a product with said temperature coefficient code word from said first input, and adding the product to said voltage level code word from said second input. Proceed to STEP 450.

STEP 450: Providing a digital-to-analog converter for converting the output voltage code word to a corresponding output voltage level.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A voltage generator on an integrated circuit chip having an output voltage with a selectable digital temperature coefficient and digital level, comprising:

a first input for a temperature coefficient code word, the temperature coefficient code word being bits representing digitally a given temperature coefficient among a predefined range of temperature coefficients of the output voltage;

a second input for a voltage level code word, the voltage level code word being bits representing digitally a given voltage level among a predefined range of output voltage levels;

a temperature sensor for sensing a temperature of the integrated circuit chip, said temperature producing a sensor voltage level to indicate a sensed temperature as a function of the sensor voltage level;

an analog-to-digital converter for receiving the sensor voltage level to yield a temperature code word, the temperature code word being bits representing digitally the sensor voltage level among a predefined range of sensor voltage levels corresponding to a predefined range of temperature;

a set of digital processing circuits for digitally computing an output voltage code word by inverting the temperature code word and forming a product with said temperature coefficient code word from said first input, and adding the product to said voltage level code word from said second input; and a digital-to-analog converter for converting the output voltage code word to a corresponding output voltage level.

2. The voltage generator as in claim 1, wherein said set of digital processing circuits further comprises:

an inverter circuit for inverting the bits of the temperature code word to inverted bits of the temperature code word;

a digital multiplying circuit for multiplying the bits of the temperature coefficient code word from said first input with the inverted bits of the temperature code word to produce an intermediate output voltage code word; and a digital adding circuit for adding the intermediate output voltage code word with the voltage level code word from said second input to produce the output voltage code word.

3. The voltage generator as in claim 1, wherein said analog-to-digital comprises:

a reference resistor string and a back of comparators forming a flash ADC;

said reference resistor string having a trimmable resistor in series; and said trimmable resistor being responsive to a value of a trim code word to shift the predefined range of sensor voltage levels relative to the a maximum value of the temperature code word.

4. The voltage generator as in claim 3, wherein the predefined range of sensor voltage levels has endpoints demarcated by predefined first and second voltage levels, the predefined first and second voltage levels corresponding respectively to predefined first and second temperatures; and the trimmer resistor has a value such that the sensor voltage level at the second predefined temperature is normalized to the predefined second voltage level.

5. The voltage generator as in claim 3, wherein said trimmable resistor is responsive to a value of the trim code word to normalize all output voltages associated with different digital temperature coefficients but a common digital level to have a common level at a given temperature designated as a convergence temperature point.

6. The voltage generator as in claim 5, wherein:

the predefined range of sensor voltage levels has endpoints demarcated by predefined first and second voltage levels, the predefined first and second voltage levels corresponding respectively to predefined first and second temperatures; and the convergence temperature point coincides with the second temperature.

7. The voltage generator as in claim 1, wherein:

the predefined range of sensor voltage levels has endpoints demarcated by predefined first and second voltage levels, the predefined first and second voltage levels corresponding respectively to predefined first and second temperatures.

8. The voltage generator as in claim 7, wherein:

the predefined first temperature is −40 degree Centigrade.

9. The voltage generator as in claim 7, wherein:

the predefined second temperature is 85 degree Centigrade.

10. The voltage generator as in claim 1, wherein the integrated circuit chip is associated with a nonvolatile memory.

11. The voltage generator as in claim 10, wherein:

the nonvolatile memory includes read and write circuits; and the output voltage is used to operate the read and write circuits.

12. The voltage generator as in claim 1, wherein the output voltage has a negative temperature coefficient.

13. A method of generating a voltage on an integrated circuit chip having an output voltage with a selectable digital temperature coefficient and digital level, said method comprising:

specifying a temperature coefficient code word, the temperature coefficient code word being bits representing digitally a given temperature coefficient among a predefined range of temperature coefficients of the output voltage;

specifying a voltage level code word, the voltage level code word being bits representing digitally a given voltage level among a predefined range of output voltage levels;

sensing a temperature of the integrated circuit chip, said temperature producing a sensor voltage level to indicate a sensed temperature as a function of the sensor voltage level;

providing an analog-to-digital converter to convert the sensor voltage level to yield a temperature code word, the temperature code word being bits representing digitally the sensor voltage level among a predefined range of sensor voltage levels corresponding to a predefined range of temperature;

providing a set of digital processing circuits for digitally computing an output voltage code word by inverting the temperature code word and forming a product with said temperature coefficient code word from said first input, and adding the product to said voltage level code word from said second input; and providing a digital-to-analog converter for converting the output voltage code word to a corresponding output voltage level.

14. The method as in claim 13, wherein said set of digital processing circuits further comprises:

an inverter circuit for inverting the bits of the temperature code word to inverted bits of the temperature code word;

a digital multiplying circuit for multiplying the bits of the temperature coefficient code word from said first input with the inverted bits of the temperature code word to produce an intermediate output voltage code word; and a digital adding circuit for adding the intermediate output voltage code word with the voltage level code word from said second input to produce the output voltage code word.

15. The method as in claim 13, wherein said analog-to-digital comprises:

a reference resistor string and a bank of comparators forming a flash ADC;

said reference resistor string having a trimmable resistor in series; and said trimmable resistor being responsive to a value of a trim code word to shift the predefined range of sensor voltage levels relative to the a maximum value of the temperature code word.

16. The method as in claim 15, wherein the predefined range of sensor voltage levels has endpoints demarcated by predefined first and second voltage levels, the predefined first and second voltage levels corresponding respectively to predefined first and second temperatures; and the trimmer resistor has a value such that the sensor voltage level at the second predefined temperature is normalized to the predefined second voltage level.

17. The method as in claim 15, wherein said trimmable resistor is responsive to a value of the trim code word to normalize all output voltages associated with different digital temperature coefficients but a common digital level to have a common level at a given temperature designated as a convergence temperature point.

18. The method as in claim 17, wherein:

the predefined range of sensor voltage levels has endpoints demarcated by predefined first and second voltage levels, the predefined first and second voltage levels corresponding respectively to predefined first and second temperatures; and the convergence temperature point coincides with the second temperature.

19. The method as in claim 13, wherein:

the predefined range of sensor voltage levels has endpoints demarcated by predefined first and second voltage levels, the predefined first and second voltage levels corresponding respectively to predefined first and second temperatures.

20. The method as in claim 19, wherein:

the predefined first temperature is −40 degree Centigrade.

21. The method as in claim 19, wherein:

the predefined second temperature is 85 degree Centigrade.

22. The method as in claim 13, wherein the integrated circuit chip is associated with a nonvolatile memory.

23. The method as in claim 22, wherein:

the nonvolatile memory includes read and write circuits; and the output voltage is used to operate the read and write circuits.

24. The method as in claim 13, wherein the output voltage has a negative temperature coefficient.

* * * * *